United States Patent [19]
Tolmie, Jr.

[11] Patent Number: 4,886,976
[45] Date of Patent: Dec. 12, 1989

[54] DRIVER CIRCUITRY FOR MULTIPLE SENSORS

[75] Inventor: Robert J. Tolmie, Jr., Brookfield, Conn.

[73] Assignee: Pitney Bowes Inc., Stamford, Conn.

[21] Appl. No.: 291,473

[22] Filed: Dec. 28, 1988

[51] Int. Cl.[4] ........................................... H01J 40/14
[52] U.S. Cl. ....................................... 250/578; 250/561
[58] Field of Search ....................... 250/560, 561, 578; 455/606, 607, 617

[56] References Cited

U.S. PATENT DOCUMENTS 3,972,622  8/1976  Mason et al. ..................... 250/578
4,171,130 10/1979  Jeschke et al. .
4,331,328  5/1982  Fasig .
4,559,451 12/1985  Curl ................................ 250/560
4,691,385  9/1987  Tupman ........................... 455/607
4,691,912  9/1987  Gillmann .

Primary Examiner—David C. Nelms
Assistant Examiner—Khaled Shami
Attorney, Agent, or Firm—Charles G. Parks, Jr.; David E. Pitchenik; Melvin J. Scolnick

[57] ABSTRACT

Driver cicuitry for multiple combination LED/silicon detector sensors arranged in an array or scattered in a machine, wherein the LEDs and detectors are connected in a matrix arrangement to common busses to reduce the number of connections and minimize interference.

8 Claims, 2 Drawing Sheets

DRIVER CIRCUITRY FOR MULTIPLE SENSORS

RELATED APPLICATION

U.S. applications, Ser. No. 291,092, filed 12/28/88, which describes using a sensor array to map the profile of an envelope flap for use in a mail handling machine; Ser. No. 291,483, filed 12/28/88, which describes a microprocessor controlled mail machine for high speed processing of mixed mail.

FIELD OF THE INVENTION

This invention relates to driver circuitry for multiple sensors, and in particular to circuitry for driving large numbers of sensors.

BACKGROUND OF THE INVENTION

Combination light-emitting diode (LED) silicon photo-detector components are commonly used as sensor units. A commercially-available component places the LED and detector side by side, both facing in the same direction from a common active surface, with the LED when pulsed emitting a narrow cone of light in one direction and the adjacent detector generating current when illuminated from the same direction. The unit is commonly used to sense the presence of a reflecting surface over the LED, by reflecting some of the intercepted radiation back toward the detector.

There are applications employing a large number of such combination units, which applications require selective activation by a controller of one or more units. Moreover, it is sometimes desirable to align the multiple units near or adjacent one another to form an array, and a problem then arises of minimizing the effect of scattered reflected radiation on detectors remote from the emitting LED. When large numbers of such combination units are present in a system, the number of connections from the controller to the units may become excessive.

SUMMARY OF THE INVENTION

An object of the invention is circuitry for driving or operating a multiplicity of such units which reduces the number of connections from a driving or operating source to the units.

Another object of the invention is a driver or operating circuit for such units which minimizes or reduces the effects of scattered light.

Still a further object is a system comprising multiple LED-detector units operated by a microcontroller enabling, with a relatively low number of connections, selection of one or more LEDs for activation, and selection of one or more detectors for reading its output current, for use as multiple sensors in a closely arranged array in or scattered throughout a system.

These and other objects and advantages as will appear hereinafter are achieved by a novel multiplexing scheme for the units. Each unit typically has four leads, one each for the LED and the detector, respectively, to provide power or source current, and two of which are used for respective connection to a sink. Each LED is activated when its source and sink lead are activated, and each detector conducts current in its detector lead when its source and sink leads are activated, and its sink detector is connected to complete the circuit.

In accordance with one aspect of the invention, the units are electrically arranged in a matrix in which each row of the matrix corresponds to a bank of the units, and each column of the matrix corresponds to units whose detector sink leads are connected in common. In this arrangement, each unit of a bank is alternately connected to one of two detector sink busses, and each LED sink lead is connected to one of four LED sink busses. If more than four are present, then the pattern repeats. All of the units in a column have their LED source leads connected in common to a source bus.

In accordance with another aspect of the invention, the units in a column are also connected in common to the same source bus.

In accordance with still another aspect of the invention, other electrically driven sensors, such as Hall-effect devices, can readily be added to the system and driven by the same matrix circuitry.

SUMMARY OF DRAWINGS

These and other features and advantages of the invention will be better understood from the following detailed description of several preferred embodiments, taken in conjunction with the accompanying drawings wherein.

DETAILED DESCRIPTION OF PREFERRED EMBODIMENTS

Figure 1:
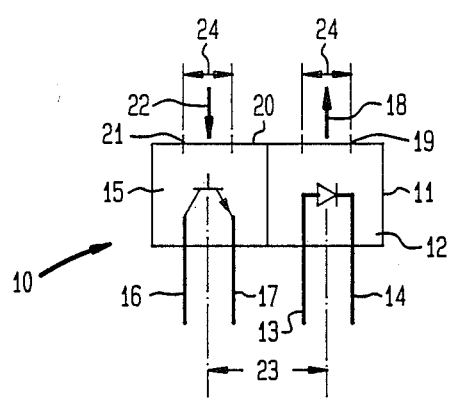
FIG. 1 is a schematic side view of a combination LED/light detector sensor.

FIG. 1 illustrates a typical combination unit 10 comprising in a single package 11 a LED 12, shown as a diode with a source lead 13 and a sink lead 14, and a silicon detector 15, shown as a base-less transistor with a collector lead 16 serving as the source lead and an emitter lead 17 serving as the sink or output lead. The LED when pulsed emits a cone-shaped radiation or light beam designated 18 through a window 19 from a common package surface 20, and the detector transistor is exposed through a window 21 at the same surface 20 to receive radiation or light designated 22. In a typical commercial unit, the center line spacing of the LED and detector, indicated by 23, is about 0.070 inches, and the widths or diameters of the LED and detector package windows 19, 21, designated 24, is about 0.050 inches.

Figure 2:
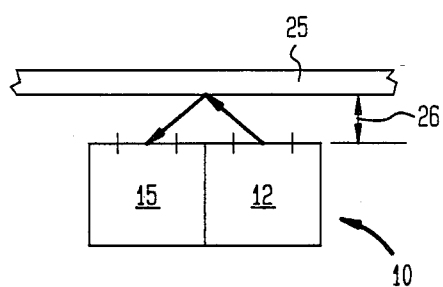
FIG. 2 is a schematic side view showing operation of the sensor of FIG. 1 as a single unit.

In a typical application for the specific example given above, as depicted in FIG. 2, a reflecting surface on a member 25 positioned over the unit 10 will cause a significant increase in detector current, over its background current in the absence of the reflector 25, when the member 25 is positioned a distance 26 which is at least about one-eighth inches to about seven-eighths inches of the center line spacing 23. For the specific example given above, this amounts to about 0.02–0.125 inches.

Figure 3:
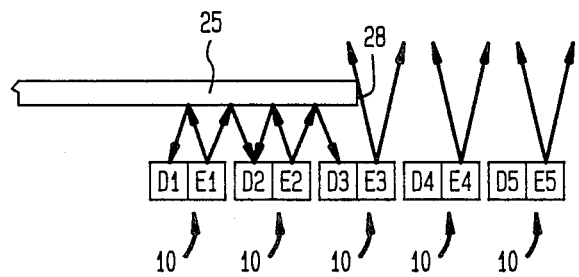
FIG. 3 is a schematic side view showing operation of multiple sensors of the type shown in FIG. 1.

FIG. 3 shows an array of five of such sensors 10 arranged in a line, the LEDs being designated by E1-E5, and the detectors by D1-D5, and with a reflecting member 25 positioned above the active surface. As will be observed, each emitter E, when emitting a cone-shaped beam, will cause reflections to be incident not only on its own detector D, but also on the adjacent detector D. Thus, for the position of the member 25 shown, D1 and D2 will detect radiation from E1, D2 and D3 from E2, but D3 and D4 will receive no radiation from E3, and so on. The outputs from D1..D5 will thus indicate the location of the edge 28 of member 25. By arranging the units in an array as shown, double the resolution is obtained, due to the presence of detectors on opposite sides of each emitter.

But, a problem in this arrangement is that the reflected radiation scatters and thus D4 may receive some radiation scattered from member 25 even though the latter is not positioned above it. Similarly, D1 may receive additional radiation from E2 even though located remote from E2.

A further problem is the presence of ambient light, from artificial or natural sources, such as sunlight. Though the radiation from an artificial source may be significant, if the LED is pulsed hard, the reflected radiation will generally exceed the ambient level from an artificial source. But, when the ambient or background radiation is from sunlight, the current generated in the detector can mask and even exceed that produced by the LED.

A feature of the invention is to reduce the effects of scattered and ambient radiation by activating only one LED at a time in an array, and only reading the currents in the adjacent detectors; thus, for E1, D1 and D2. But from FIG. 1, activation of four leads are necessary for selected LED activation and selected detector readings. The brute force solution for the five unit array of FIG. 2 is to provide $5 \times 4 = 20$ connections to the controller. For an array of 20 units, 80 connections would be necessary.

In accordance with one aspect of the invention, a multiplexing scheme is provided which allows selected activation of LEDs, and selected reads of detectors, with fewer connections, and without compromising on scatter and ambient light interferences.

Figure 4:
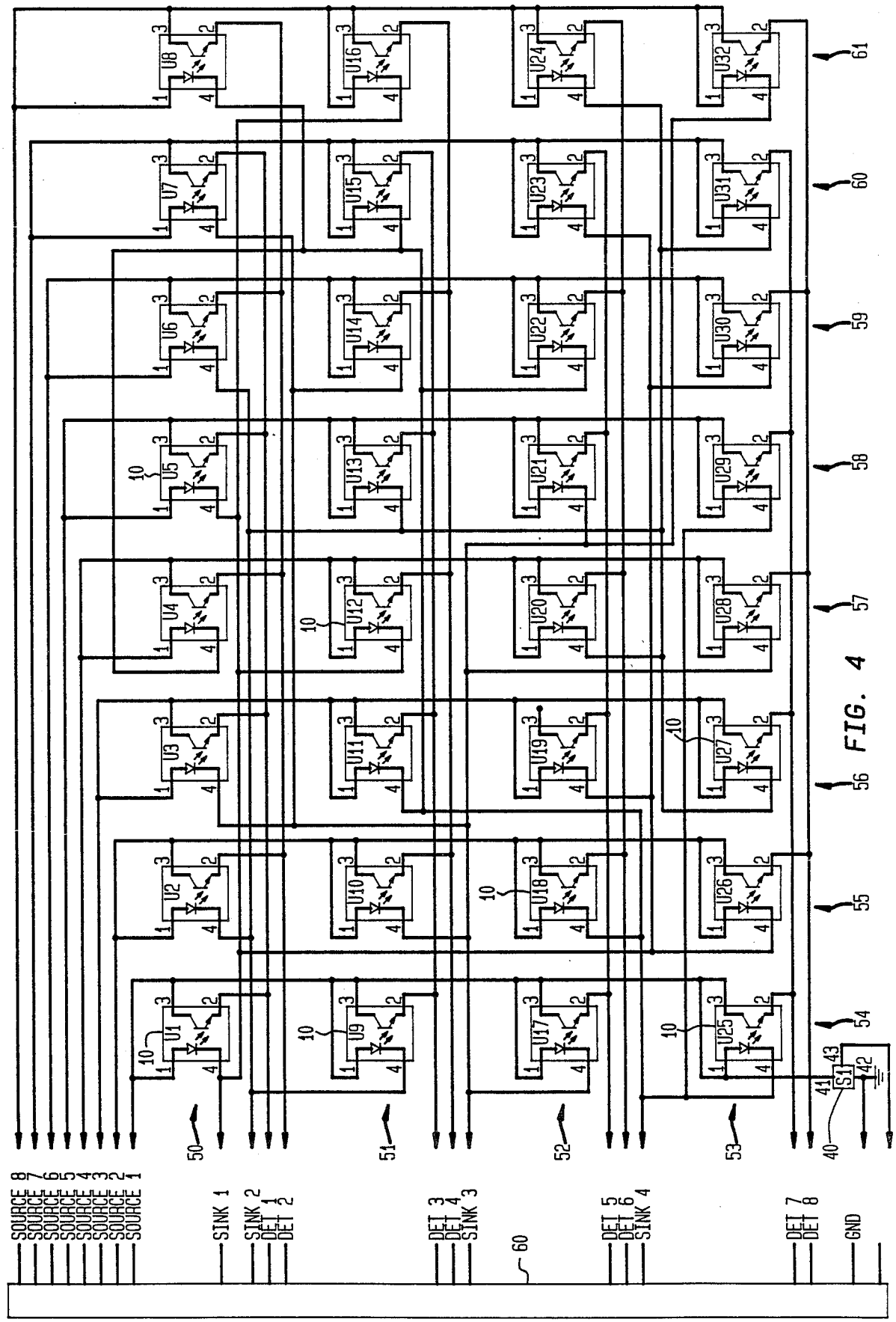
FIG. 4 is an electrical schematic of one form of driver circuitry in accordance with the invention.

A preferred multiplexing scheme is illustrated in FIG. 4, which comprises 32 units designated U1–U32, electrically arranged in a $4 \times 8$ matrix comprising 4 rows 50–53 of 8 columns 54–61 of units, with the first row 50, sometimes referred to as the first bank, comprising units U1-U8, and the second row 51 comprising units U9-U16, and so on. Each unit has four leads designated as follows: 1 to the anode side of the LED, 4 to the cathode side, 3 to the collector of the detector transistor and 2 to the emitter. Arrows are present to show the optical connection, which exist only when a reflector is located above the unit.

For the $4 \times 8$ array shown, 8 source busses Source 1-Source 8 are provided. In accordance with the invention, each source bus is connected to the source lines 1 and 3 of each unit in a column. Thus, Source 1 bus is connected to the source leads 1, 3 of units U1, U9, U17, U25. The other source bus connections are evident from FIG. 4.

Sink busses 1–4 are provided for the LEDs, but connected to the LEDs in a pattern to space the connected LEDs apart, preferably as far apart as possible. Thus, the Sink 1 bus is connected to the LED Sink leads 4 of units U1, U5, U12, U16, U19, U23, U26, and U30; Sink 2 bus to units U2, U6, U9, U13, U20, U24, U27 and U31; and so on. In addition, 8 detector busses Det 1–8 are provided, each detector bus being connected to alternate units in a row, i.e., two detector busses per row. Thus, Det 1 bus is connected to the detector sink leads 2 of units U1, U3, U5 and U7 in row 50; Det 2 bus to units U2, U4, U6 and U8 in row 51; Det 3 and 4 busses to rows 52 and 53 in a similar arrangement.

Thus, for the 32 units shown, instead of 128 connections, only $8+4+8=20$ lines to the external system controller 60 are required, a saving of 108 lines to the controller.

In a typical operation, the controller 60 would activate Source bus 1 by applying 5 volts to it. Either the detector busses would be selected depending on position and function of the unit, or all detector busses could be connected to a suitable circuit for reading analog currents, or for converting the analog currents via an A/D converter to a digital value and then reading the digital value. These circuits typically would be connected between the detector busses and the controller, with the resultant digital value passed on to the controller. In either case, at this point in time, none of the LEDs are activated, since none of the sink busses are grounded. Even though all of the detectors may be active, the only current flowing in the 8 detector busses is that due to ambient or background radiation. Desirably, this value is measured during a first time interval, to be used as a reference.

Next, one LED sink bus is activated, as by grounding, say Sink 1. The only LEDs emitting would be those whose source lead and sink lead are both activated. For the case illustrated, Source 1 bus activates units U1, U9, U17, U25; Sink 1 bus activates units U1, U5, U12, U16, U19, U23, U26, U30; it is thus evident that only unit U1 has its LED source and sink lines simultaneously activated; thus only the LED in U1 turns on. Assuming, as is typical, that the background current in the detector bus Det 1 connected to unit U1 only comes from one unit in the row, namely U1, this would amount to about 1 uA of current, because U3, U5, U7 do not have any source power. With, say, a white document positioned over unit U1 as shown in FIG. 2, and with the diode pulsed hard, which is possible if the pulse width is short, the current generated by detector D1 is of the order of 10 mA providing an excellent signal with excellent signal/noise (S/N) ratio.

Summarizing, even though the number of connections has been drastically reduced, it is possible to turn on any single LED or detector desired in the 32 unit matrix, and it is possible to read the current in its adjacent detector and obtain a high S/N ratio by activating only a subset of the detectors in the matrix.

As explained in connection with the FIG. 3 arrangement, it is sometimes desirable to read the current in the detectors on oposite sides of the selected LED, thus detectors D1 and D2 when E1 is turned on. This is easily achieved in the circuit configuration shown in FIG. 4, because alternate units in a row are connected to different detector lines. Thus, assuming U1 corresponds to the first unit in the FIG. 3 array, and U2 corresponds to the second unit, Det bus lines 1 and 2 if separately or sequentially read when Source 1, Source 2 and Sink 1 busses are activated, will enable the controller 60 to read just the currents from the detectors in units U1 and U2 and thus be able to determine the position of member 25. This may require the sequential activation of several LEDs and the sequential reading of several detectors, and this has been described in detail in the related copending application, Ser. No. 291,092, whose contents are hereby incorporated by reference.

The selected activation and reading would typically be done by the controller 60, typically a programmed or programmable microcontroller, by applying, for example, a 5 volt pulse to the desired source busses, ground or a negative voltage to the desired sink busses, and if desired ground via a series load resistor to each of the detector busses. Thus, by appropriate programming of the controller, for example a microcontroller such as the 8051, the units can be selectively activated and read in any desired sequence or pattern.

While the problems are most severe when the units are stacked together in an array, when the units are scattered throughout a machine, such as a document handling or mail handling machine, each performing separate functions, such as detecting the leading and trailing edges of documents, or the presence of documents in a hopper or at a particular station, it greatly simplifies the circuitry if for the 32 units illustrated only 20 busses are necessary, and thus the LED of each unit can be selectively turned on and the detector of that unit read on a cyclical basis over a time interval reserved by the microcontroller for that function. This has been described in copending application, Ser. No. 291,477, whose contents are incorporated by reference.

The number of detector lines shown in FIG. 4 could be reduced to two if ambient light is not present, and could even be reduced to one if there were no requirement to turn on one LED and look at two detectors. The invention is not limited to the 4×8 dimensional array shown. It obviously can be applied to as few as 4 units, connected in one row or in a 2×2 matrix. In the single row arrangement, 4 source busses, 2 detector busses and 2–4 sink busses would be required, still well below the 16 connections needed. In the 2×2 matrix, the bus count could be reduced to 8, with 2 source busses, 4 detector busses, and 2 sink busses. There is no upper limit to the number of units possible, provided that the detector lines are grouped to avoid excessive background current. The related copending application, Ser. No. 291,092, shows an implementation for mapping the profile of an envelope flap in a high speed mixed mail handling machine employing 23 units arranged in 3×8 array (with the 24th unit omitted) employing 8 source busses, 4 sink busses and 2 detector busses.

Also, the units involved are not limited to LEDs and silicon transistors, though such units are commonly available nowadays at low cost. Obviously, other radiators, activated by current or voltage, can be substituted for the LEDs, and other radiation sensitive detectors for the silicon transistors. The dimensions given in the specific example are not limiting. Other geometries of such units exist for detecting the presence of a reflector surface at a closer or a further distance.

One of the features of the invention is that it is possible to add to the circuit other electrically activated detectors that can be selected as desired. For instance, a common sensor is a Hall-effect detector, activated by a magnetic field, which comprises an IC containing a Hall-effect device and an amplifier, and typically contains three leads, of which one receives power of for example 5 volts, the second ground, and the third is the output lead which carries a current dependent upon the presence or absence of a local magnetic field. Such a unit is depicted in FIG. 4 at 40, as S1, with 41 the power lead, 42 a permanent ground, and 43 the output. In the configuration shown, unit 40 can be activated when U25 is activated by activating the source 1 bus. By reading the current on lead 43, the state of the Hall-effect detector 40 can be determined. Thus, the system readily accommodates not only a multiplicity of combination units U1–U32, but also one or more other electronically activated sensors such as 40.

Different types of detectors may require different types of signal processing and it may be desirable for certain applications to group different types of detectors together. For example, the Hall device 40 could have an analog output but in the present application it has a digital output and is connected to a separate detector line. But, seven more Hall devices could if desired be connected to the same detector line as long as each one used a different source voltage by being connected to another of the eight available source lines in the particular circuit illustrated in FIG. 4.

As mentioned above, the sensors can be arranged closely adjacent one another to form a single array performing a single function, such as the flap profiler described in the copending application, or the sensors can be performing different functions in a single system under control of the controller 60. Sensing need not be continuous, but can be periodic if the period is chosen smaller than the expected event time. The multiplexing scheme described not only reduces connections but also reduces the controller overhead. Moreover, by pulsing the LEDs with a small duty cycle, they can be driven harder thus emitting more light to increase the S/N ratio. The common connection of both source leads 1, 3 in FIG. 3 to the same source bus also helps reduce connections. Typically, these would be turned on first, together with the desired detector bus, and the detector current due to ambient light recorded, following which the desired LED sink line would be grounded to produce LED radiation, and a second reading of the detector current made and compared with the ambient value. The above sequence would take place each cycle, say once each millisecond, and would consume only, say, about 20 uS. Thus, many sensors could be activated and read during each millisecond interval. As an alternative, the detector lines can be maintained active continuously, and read just before and during the adjacent LED activation, by polling under the control of the controller.

While the invention has been described and illustrated in connection with preferred embodiments, many variations and modifications as will be evident to those skilled in this art may be made therein without departing from the spirit of the invention, and the invention as set forth in the appended claims is thus not to be limited to the precise details of construction set forth above as such variations and modifications are intended to be included within the scope of the appended claims.

What is claimed is:

1. Driver circuitry for multiple sensors comprising:
    a plurality of sensors each comprising radiation generating and radiation detecting means and source leads for applying source current to the radiation generating and detecting means and sink leads for the source current,
    said sensors being arranged in a matrix of rows and columns,
    a plurality of source busses,
    a plurality of sink busses,
    a plurality of detector busses,
    means connecting each of the source busses to the radiation generating source leads of one of the columns of sensors, means connecting the detector sink leads of alternate sensors in a row in common to one of the detector busses.

2. The circuit of claim 1 wherein the number of source busses equals the number of columns.

3. The circuit of claim 1 wherein the source leads of the detector are connected to the same bus as the source leads of the generator.

4. The circuit of claim 1 wherein the sink leads of adjacent generators are connected to different sink busses.

5. The circuit of claim 4 wherein the connections to the generator sink leads are configured such that generators in adjacent rows and columns never generate at the same time.

6. The circuit of claim 1 wherein the generators are LEDs, and the detectors are silicon detectors.

7. The circuit of claim 6 wherein Hall-effect detectors are connerted to the matrix.

8. The circuit of claim 6 wherein the LEDs and silicon detectors are packaged together and face a common surface.

* * * * *